METHOD OF MAKING SEMICONDUCTOR DEVICE

Filed May 14, 1971

INVENTOR.
RAM S. RONEN
BY Donald S. Cohen
ATTORNEY 3,740,280

METHOD OF MAKING SEMICONDUCTOR DEVICE

Ram Shaul Ronen, Kendall Park, N.J., assignor to RCA Corporation

Filed May 14, 1971, Ser. No. 143,493
Int. Cl. H01l 7/50
U.S. Cl. 156—11 3 Claims

ABSTRACT OF THE DISCLOSURE

A semiconductor device is made by forming on the surface of an electrical insulating substrate a plurality of spaced regions of a semiconductor material. A masking layer is provided on the surface of each semiconductor region. A layer of an electrical insulating material is coated on the surface of the substrate between and around the semiconductor regions and over the masking layers on the semiconductor regions. A photosensitive resist is coated over the insulating layer. Openings are provided in the resist over each of the semiconductor regions using the masking layers to define the openings. The exposed portions of the insulating layer over each of the semiconductor regions are removed leaving the insulating layer between and around the semiconductor regions.

BACKGROUND OF THE INVENTION

The invention herein disclosed was made in the course of or under a contract or subcontract thereunder with the Department of the Air Force.

The present invention relates to a method of making semiconductor devices of the type which include a layer of a single crystalline semiconductor material on a substrate of an electrical insulating material (hereinafter referred to as "SOS" devices). More particularly, the present invention relates to a method of forming SOS integrated circuits having planar interconnecting metallization patterns.

SOS semiconductor devices comprise a flat substrate of an electrical insulating material, such as sapphire or spinel, having an epitaxial layer of a single crystalline semiconductor material, generally silicon, on a surface thereof. Various types of active semiconductor devices can be formed in the semiconductor material layer by providing in the layer various regions of different conductivity types and/or films of insulating material and conductive metals on various areas of the layer. For SOS integrated circuits, the semiconductor layer is generally separated into two or more spaced regions by removing portions of the layer from between the regions so that the regions are electrically isolated from each other. Various active and passive devices are formed in each of the regions and are electrically connected in a desired circuit by a metallization pattern of interconnecting strips. To electrically connect the devices in one region of the semiconductor material layer with those in another region, the metallization pattern must extend over the surface of the substrate between the regions. For this purpose, the metallization pattern must extend from the surface of the region of the semiconductor material layer down along the edge of the region to the substrate surface and then along the surface. To form the metallization pattern along the edges of the semiconductor layer regions is difficult and often results in discontinuities which cause open circuits in the metallization pattern.

SUMMARY OF THE INVENTION

A semiconductor device is made by providing on a surface of a substrate of an electrical insulating material at least one region of a layer of single crystalline semiconductor material which region is smaller in area than the area of the surface of the substrate. An opaque masking layer is provided on the surface of the region of the semiconductor material layer. A layer of an electrical insulating material is applied over the exposed area of the surface of substrate and over the masking layer. The portion of the insulating layer over the masking layer is then removed using the masking layer to define the portion of the insulating layer which is removed.

DETAILED DESCRIPTION

Figure 1:
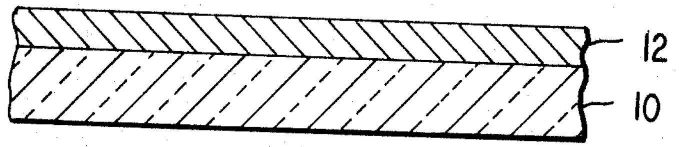
FIGS. 1–8 are sectional views illustrating the various steps of the method of the present invention.

To make an SOS semiconductor device in accordance with the method of the present invention one starts with a flat substrate 10 having a layer 12 of a single crystalline semiconductor material on a surface thereof as shown in FIG. 1. The substrate 10 is of an electrical insulating material on which the semiconductor material layer 12, which is generally silicon, can be epitaxially grown and which is either transparent or translucent to either visible or infrared light. Either sapphire or spinel are suitable materials for the substrate 10. The semiconductor layer 12 can be deposited on the substrate 10 by any well known epitaxial technique. For example, a layer 12 of single crystalline silicon can be deposited on the substrate 10 by placing the substrate in a deposition chamber which is filled with a gaseous mixture of silane such as $SiH_4$ and hydrogen and which is heated to a temperature, approximately 1050° C., at which the silane reacts to form silicon. The silicon deposits on the substrate 10 as a single crystalline layer.

Figure 2:
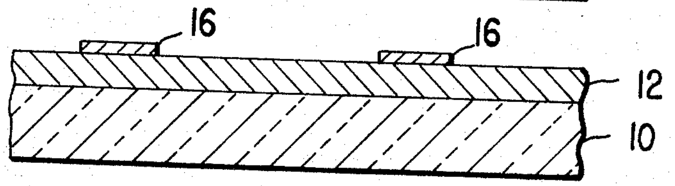
Figure 3:
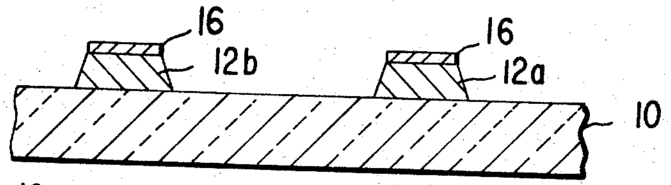

The semiconductor layer 12 is then formed into spaced regions. This is achieved by applying a masking layer 16 onto the surface of the semiconductor layer over each area which is to be a region, as shown in FIG. 2. The masking layer 16 is of a material which is opaque to the type of light with regard to which the substrate 10 is transparent or translucent. Also, the masking layer 16 is of a material which can be etched by an etchant which will not attack the semiconductor layer 12 and will not be attacked by an etchant that will etch the semiconductor layer. A metal, such as gold or platinum, is suitable for the masking layer 16. The masking layer 16 can be formed over each of the desired areas of the semiconductor layer 12 by coating the entire surface of the semiconductor layer with a layer of the desired material, such as one of the previously stated metals, which said layer being thick enough to be opaque. Using standard photolithographic techniques a resist film is coated on the areas of the layer to be retained. The uncoated area of the layer is then removed, such as by a chemical etchant, leaving the masking layers 16. The portions of the semiconductor layer 12 not coated with a masking layer 16 are then removed, such as by etching with an etchant which does not attack the masking layer. For example, if the semiconductor layer 12 is of silicon and the masking layer 16 of platinum, the uncoated portions of the semiconductor layer 12 can be etched away with potassium hydroxide. As shown in FIG. 3, this provides spaced regions **12*a* and 12*b* of the semiconductor layer 12 each having a masking layer 16** on the surface thereof.

Figure 4:
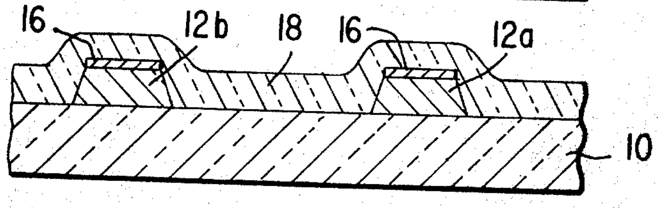

As shown in FIG. 4, a layer 18 of an electrical insulating material is then coated over the exposed portion of the surface of the substrate 10 and over the semiconductor regions **12*a* and 12*b* so as to extend over the masking layers 16. The insulating layer 18 may be of any electrical insulating material which can be etched by an etchant which will not attack the masking layers 16. For example, the insulating layer 18 may be of silicon dioxide, silicon nitride or aluminum oxide or a suitable glass. The insulating layer 18 should be of a thickness at least as thick as the semiconductor regions 12***a* and 12*b* so that the insulating layer fills the space between the semiconductor regions. The insulating layer 18 may be applied by any well known technique for coating the particular insulating material on the substrate 10. For example silicon dioxide, silicon nitride an aluminum oxide can be applied by pyrolytically reacting a gaseous mixture containing the elements of the insulating material to form the insulating material which is deposited on the substrate 10. Silicon dioxide can be deposited from a mixture of silane and either oxygen or water vapor, silicon nitride from silane and gaseous ammonia, and aluminum oxide from aluminum chloride carbon dioxide and hydrogen.

Figure 5:
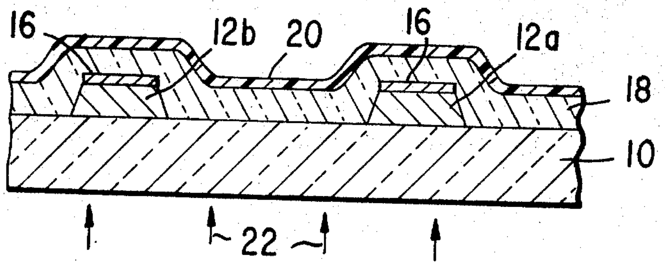
Figure 6:
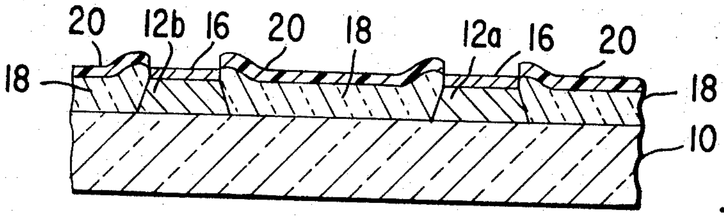

As shown in FIG. 5, a film 20 of a photosensitive resist material is then coated on the surface of the insulating layer 18. The resist material used is of the type which is set when exposed to light, either visible or infrared. A light is then directed on the uncovered surface of the substrate 10 as indicated by the arrows 22 in FIG. 5. The light passes through the substrate 10 and insulating layer 18 to contact and set the photosensitive resist film 20. However, since the masking layer 16 is opaque to the light, the light will not pass through the masking layer 16 so that the portion of the photosensitive resist film 20 directly over each masking layer 16 is not set by the light. Thus, the entire photosensitive resist film 20 except for the areas directly over the masking layers 16 is set by exposure to the light directed through the substrate 10. The unset areas of the photosensitive resist film 20 over the masking layers 16 are then removed, such as by washing them away with water, to expose the areas of the insulating layer 18 which are directly over the masking layers 16. As shown in FIG. 6, the exposed areas of the insulating layer 18 are removed, such as by a suitable chemical etchant. Since the insulating layer 18 can be etched by an etchant which will not attack the masking layer 16, the exposed portions of the insulating layer can be completely etched away down to the masking layers 16.

Figure 7:
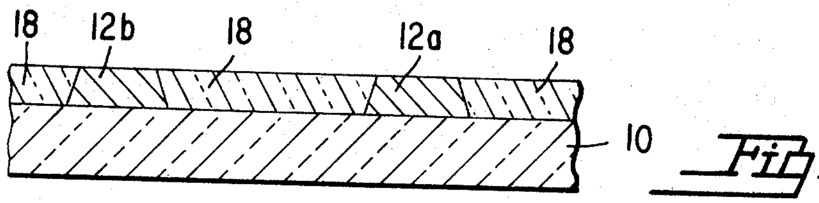
Figure 8:
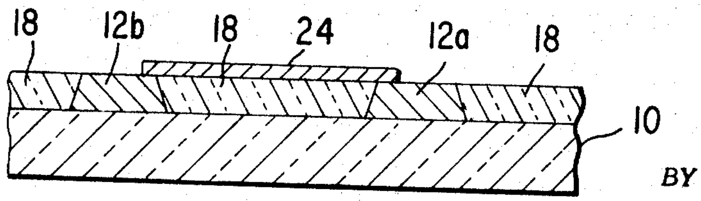

The masking layers 16 are then removed, such as by a suitable etchant. Since, as previously stated, the masking layer 16 is of a material which can be etched by an etchant which will not attack the material of the semiconductor layer 12, the masking layers 16 can be completely removed to expose the surfaces of the semiconductor regions 12*a* and 12*b*. The resist film 20 is then removed with a suitable solvent and the sharp edges of the insulating layer 18 adjacent the edges of the semiconductor regions 12*a* and 12*b* are smoothed out with a suitable etchant. As shown in FIG. 7, this leaves an insulating layer 18 on the surface of the substrate 10 between and around the semiconductor regions 12*a* and 12*b* with the surface of the insulating layer being substantially co-planar with the surface of the semiconductor regions 12*a* and 12*b*. Various active and passive components can then be formed in or on each of the semiconductor regions 12*a* and 12*b* in a manner well known in the art. If desired, the various active and passive components of the integrated circuit can be formed in or on the semiconductor layer 12 before the semiconductor layer is formed into the semiconductor regions 12*a* and 12*b*. A metallization pattern is coated on the surfaces of the insulating layer 18 and the semiconductor regions 12*a* and 12*b*. As shown in FIG. 8 the metallization pattern can include a metal film 24 which extends over the insulating layer 18 from the semiconductor region 12*a* to the semiconductor region 12*b* so as to electrically connect the circuit components formed in the semiconductor regions.

Since the surface of the insulating layer 18 is co-planar with the surfaces of the semiconductor regions 12*a* and

12*b* and the insulating layer fills the space between the semiconductor regions, the metallization pattern does not extend over any sharp corners or bends. Thus, the chances of causing any discontinuities in the metallization pattern which provides open circuits is greatly reduced. Also, the insulating layer 18 between the semiconductor regions 12*a* and 12*b* acts as an insulator to reduce parasitic capacitances. In the method of the present invention, the masking layers 16 on the semiconductor portions 12*a* and 12*b* make the semiconductor regions self-aligning. This provides for greater ease of accurately removing only the portions of the insulating layer 18 from over the semiconductor regions so as to leave the space between the semiconductor regions completely filled with the insulating layer.

I claim:

1. A method of making a semiconductor device comprising:

(a) depositing on a surface of a substrate of an electrical insulating material a layer of single crystalline silicon, (b) coating an opaque metal masking layer on spaced areas of said silicon layer, (c) removing the uncoated area of the silicon layer to leave a plurality of spaced regions of the single crystalline silicon on said substrate with the area of said surface of the substrate between the regions being exposed, (d) depositing a layer of an electrical insulating material over the exposed area of the substrate and over the masking layer, (e) coating the insulating material layer with a layer of a photosensitive resist which is set by exposure to light, (f) shining a light through the substrate and the ininsulating layer to set the resist while the masking layer blocks the light from setting the resist directly over the masking layer, (g) removing the unset portion of the resist to expose the portion of the insulating layer over the masking layer, (h) etching away the exposed portion of the insulating layer by etching with an etchant which does not substantially attack the masking layer so as to provide on the substrate a plurality of regions of the single crystalline silicon with the insulating material extending between said regions, (i) after the exposed portion of the insulating layer is etched away, the masking layer is removed to expose the surface of each of the silicon regions, (j) after the masking layer is removed the remaining resist layer is removed, and (k) finally removing sufficient insulating layer to obtain a smooth surface.

2. The method of claim 1 in which the insulating material layer is of a thickness substantially equal to the thickness of the single crystalline silicon layer.

3. The method of claim 1 in which the uncoated area of the semiconductor layer is removed by etching with an etchant which does not substantially attack the masking layer.

References Cited

UNITED STATES PATENTS 3,442,647 5/1969 Klasens ............ 96—36.2

JACOB H. STEINBERG, Primary Examiner

U.S. Cl. X.R.

96—36.2; 156—17; 317—235 B